United States Patent [19]
Nakagawa et al.

[11] Patent Number: 5,708,287
[45] Date of Patent: Jan. 13, 1998

[54] POWER SEMICONDUCTOR DEVICE HAVING AN ACTIVE LAYER

[75] Inventors: Akio Nakagawa, Hiratsuka; Yoshihiro Yamaguchi, Urawa; Tomoko Matsudai, Tokyo, all of Japan

[73] Assignee: Kabushiki Kaisha Toshiba, Kawasaki, Japan

[21] Appl. No.: 564,449

[22] Filed: Nov. 29, 1995

[51] Int. Cl.$^6$ .................... H01L 27/01; H01L 27/12; H01L 31/0392

[52] U.S. Cl. .................. 257/350; 257/351; 257/552; 257/553; 257/554; 257/556; 257/577

[58] Field of Search ................... 257/350, 351, 257/552, 553, 554, 556, 558, 559, 563, 577

[56] References Cited

U.S. PATENT DOCUMENTS

| | | | |
|---|---|---|---|
| 4,478,655 | 10/1984 | Nagakubo et al. | |
| 4,843,448 | 6/1989 | Garcia et al. | |
| 4,982,263 | 1/1991 | Spratt et al. | |
| 5,102,809 | 4/1992 | Eklund et al. | 437/21 |
| 5,126,806 | 6/1992 | Sakurai et al. | |
| 5,212,397 | 5/1993 | See et al. | 257/347 |
| 5,323,055 | 6/1994 | Yamasaki | 257/588 |
| 5,371,401 | 12/1994 | Kurita | 257/524 |
| 5,448,104 | 9/1995 | Yallup | 257/558 |
| 5,510,647 | 4/1996 | Nakajima et al. | 257/559 |

OTHER PUBLICATIONS

1992 IEDM Technical Digest, "Self–Heating In High Performance Bipolar Transistors Fabricated on SOI Substrates", P.R. Ganci, et al., (pp. 417–420), 1992 No Month.

Proceedings of 1990 International Symposium on Power Semiconductor Devices & ICs, "New 500V Output Device Structures for Thin Silicon Layer on Silicon Dioxide Film", (pp. 97–101), A. Nakagawa, et al., 1992 No Month.

*Primary Examiner*—Ngân V. Ngô
*Attorney, Agent, or Firm*—Oblon, Spivak, McClelland, Maier & Neustadt, P.C.

[57] ABSTRACT

An $n^-$-type silicon active layer having a thickness of 6 μm or less is formed on a silicon substrate via a silicon oxide film. An npn bipolar transistor with a low withstand voltage and an IGBT with a high withstand voltage are formed in the active layer. The two devices are insulated and isolated from each other through a trench. The bipolar transistor has an n-type well layer formed in the surface of the active layer. A p-type well layer is formed in the surface of the n-type well layer. The thickness of the n-type well layer under the p-type well layer is set to be 1 μm or more. A first $n^+$-type diffusion layer is formed in the surface of the n-type well layer. A $p^+$-type diffusion layer and a second $n^+$-type diffusion layer are formed in the surface of the p-type well layer. The n-type well layer and the first $n^+$-type diffusion layer serve as a collector region. The p-type well layer and the $p^+$-type diffusion layer serve as a base region. The second $n^+$-type diffusion layer serves as an emitter region.

25 Claims, 12 Drawing Sheets

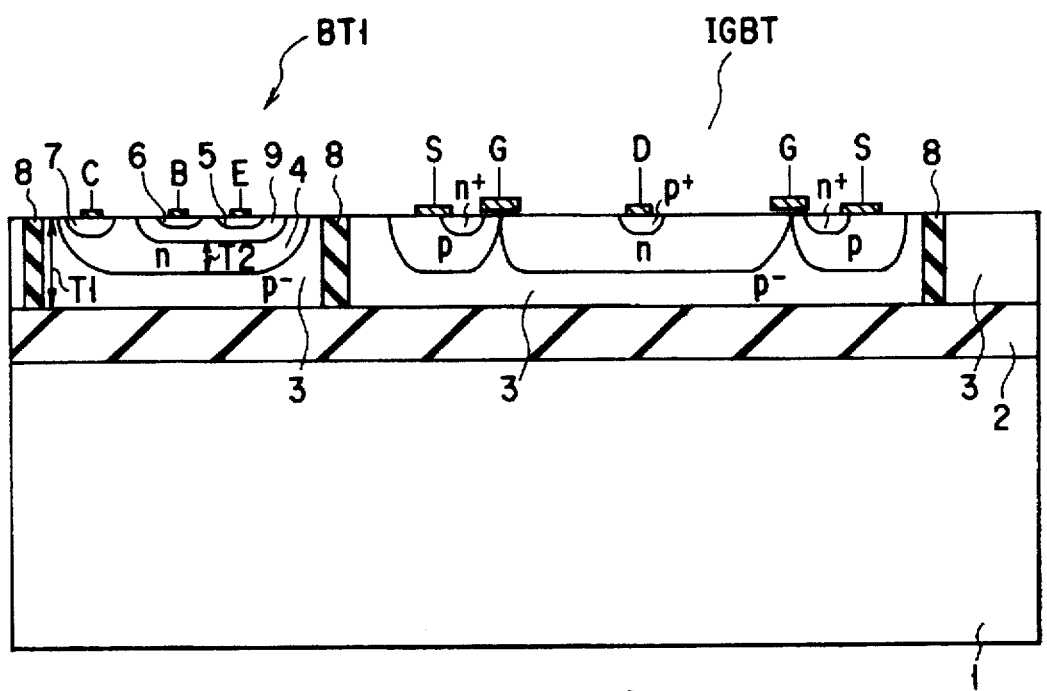
F I G. 4
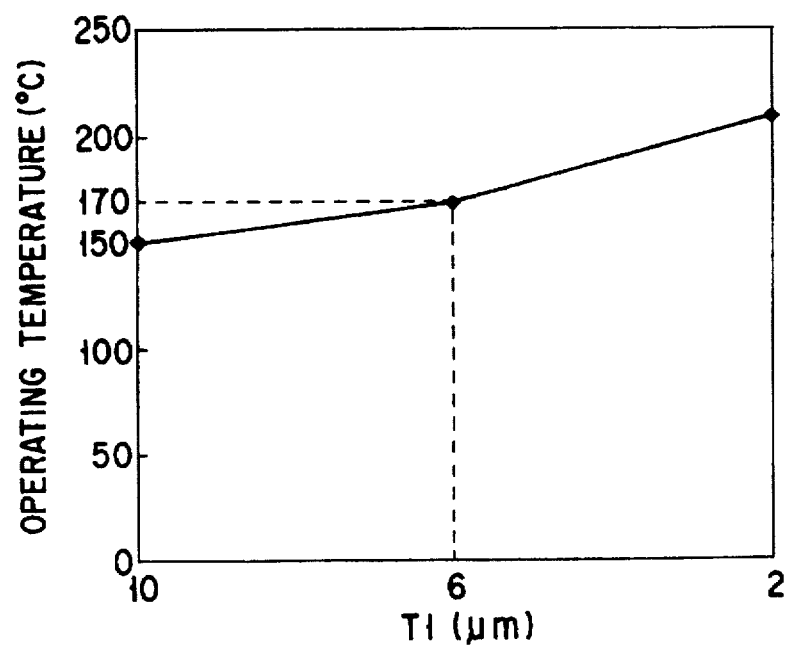
F I G. 8

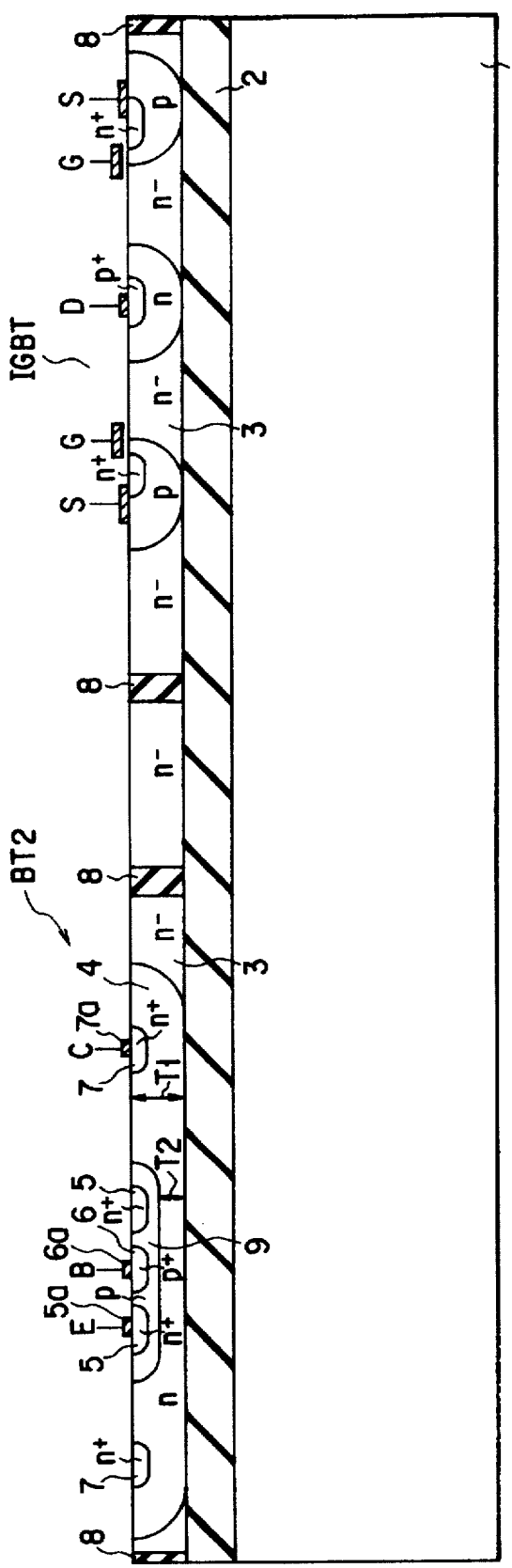
F I G. 5A
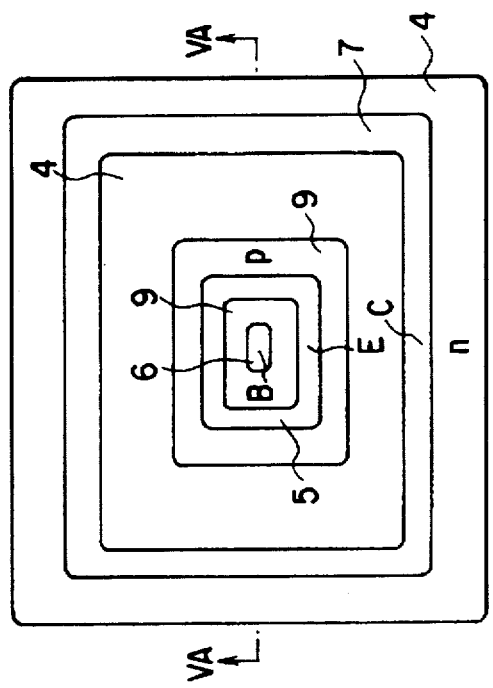
F I G. 5B

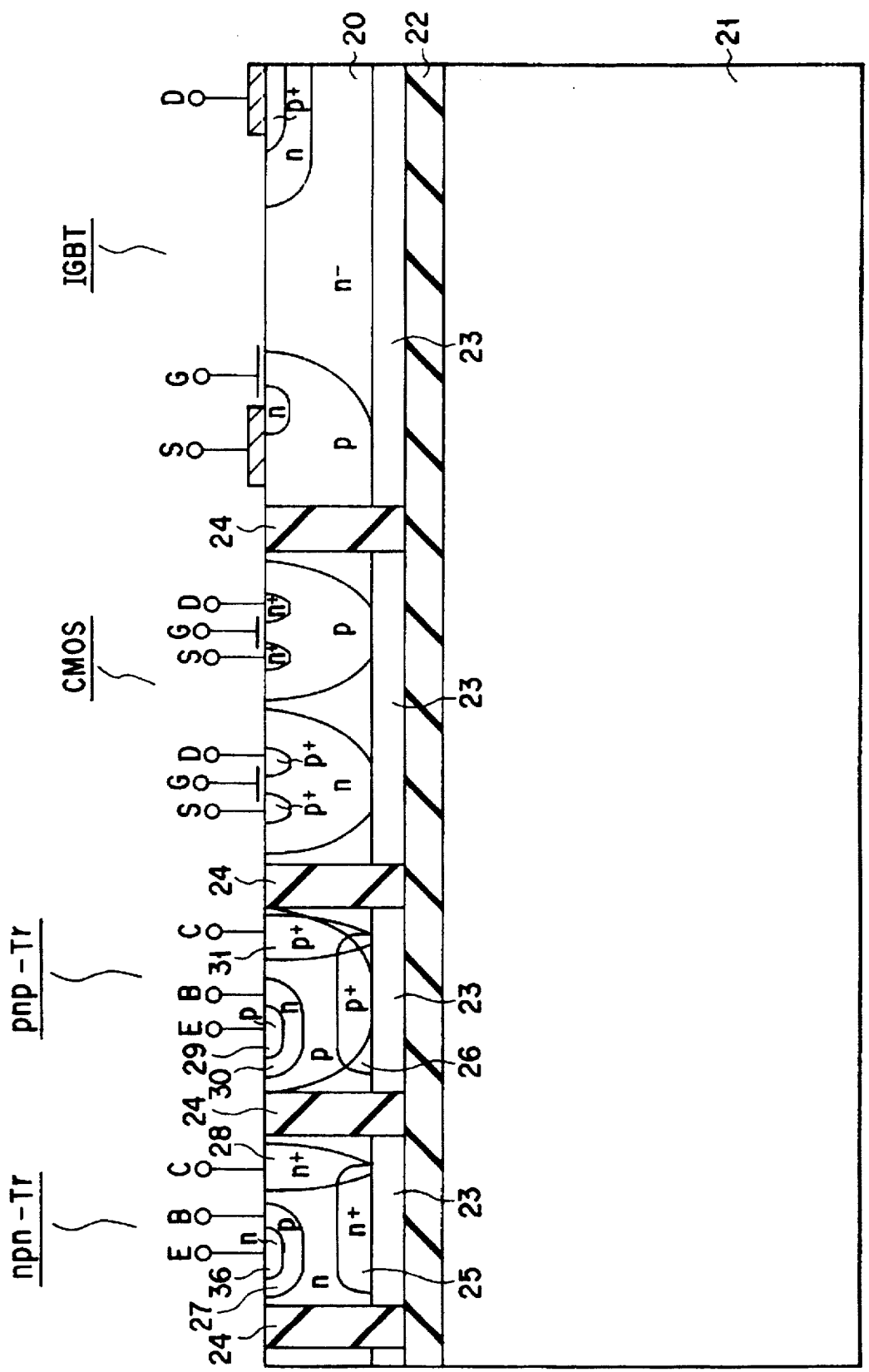
F I G. 16

5,708,287

POWER SEMICONDUCTOR DEVICE HAVING AN ACTIVE LAYER

BACKGROUND OF THE INVENTION

1. Field of the Invention

The present invention relates to a semiconductor device and, more particularly, to a power IC having elemental devices formed in an SOI (semiconductor on insulator) substrate.

2. Description of the Related Art

Recently, integrated circuits (ICs), each having many transistors, resistors, and the like connected to form an electric circuit and integrated into one chip, have been widely used for the important portions of computers and communication equipments. Of these ICs, an IC including a high-withstand-voltage device is called a power IC.

Elemental devices arranged in a power IC include a vertical bipolar transistor. A vertical bipolar transistor is a transistor in which, for example, a base region is selectively formed in the surface of a collector region in a semiconductor layer, and an emitter region is selectively formed in the surface of the base region, so that a main current path extends vertically. The collector, base, and emitter regions are respectively connected to electrodes through low-resistance contact layers formed in the surfaces of the respective regions. A low-resistance buried layer containing an impurity at a high concentration is formed in the lower portion of the collector region. The buried layer may or may not be directly connected to the collector contact layer.

The buried layer in the collector region decreases the resistance on the collector region side, and plays an important role in obtaining good device characteristics. However, in order to form the buried layer, several steps must be added. This contradicts the cost requirement that a plurality of devices to be arranged in a power IC should be formed in common steps to manufacture the IC in the minimum number of steps.

SUMMARY OF THE INVENTION

It is an object of the present invention to provide a semiconductor device which can be manufactured in a small number of manufacturing steps and has excellent device characteristics.

According to a first aspect of the present invention, there is provided a semiconductor device comprising:

a support substrate having an insulating surface;

a semiconductor active layer formed on the substrate, the active layer having a thickness which is set to be 6 μm or less;

a main well layer of a first conductivity type formed in a surface of the active layer;

a sub-well layer of a second conductivity type formed in a surface of the main well layer, the main well layer under the sub-well layer having a thickness which is set to be 1 μm or more;

an emitter layer of the first conductivity type formed in a surface of the sub-well layer;

a collector electrode formed on a surface of the main well layer;

a base electrode formed on a surface of the sub-well layer; and an emitter electrode formed on a surface of the emitter layer. According to a second aspect of the present invention, there is provided a power IC comprising:

a support substrate having an insulating surface;

a semiconductor active layer formed on the substrate, the active layer having a thickness which is set to be 6 μm or less;

a device isolation layer formed to reach the insulating surface from a surface of the active layer so as to divide the active layer into first and second areas insulated and isolated from each other;

a low-withstand-voltage, first semiconductor device formed in the first area; and a high-withstand-voltage, second semiconductor device formed in the second area, the first semiconductor device comprising:

a first main well layer of a first conductivity type formed in a surface of the active layer;

a first sub-well layer of a second conductivity type formed in a surface of the main well layer, the first main well layer under the first sub-well layer having a thickness which is set to be 1 μm or more;

a first emitter layer of the first conductivity type formed in a surface of the first sub-well layer;

a collector electrode formed on a surface of the first main well layer;

a base electrode formed on a surface of the first sub-well layer; and an emitter electrode formed on a surface of the first emitter layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a sectional view showing the main part of a power IC according to another embodiment of the present invention;

FIGS. 5A and 5B are a sectional view and a plan view, respectively, showing the main part of a power IC according to still another embodiment of the present invention;

FIG. 8 is a graph showing the relationship between the thickness of an active layer and the operating temperature at which elemental devices can be used;

FIGS. 16 to 21 are sectional views, each showing the main part of a power IC according to still another embodiment of the present invention.

DETAILED DESCRIPTION OF THE PREFERRED EMBODIMENTS

Figure 1A:
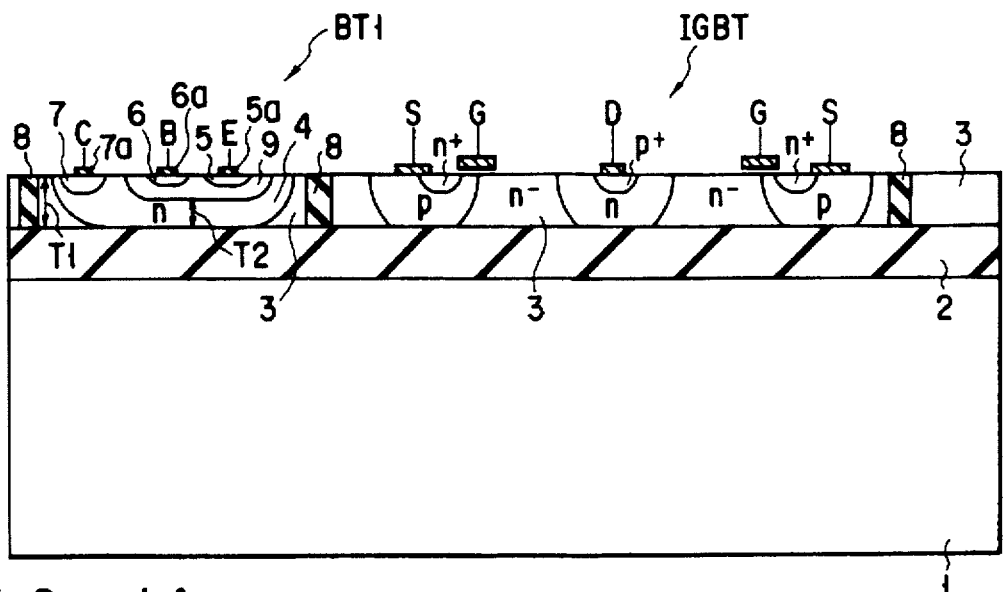
FIGS. 1A and 1B are a sectional view and a plan view, respectively, showing the main part of a power IC according to an embodiment of the present invention.
Figure 1B:
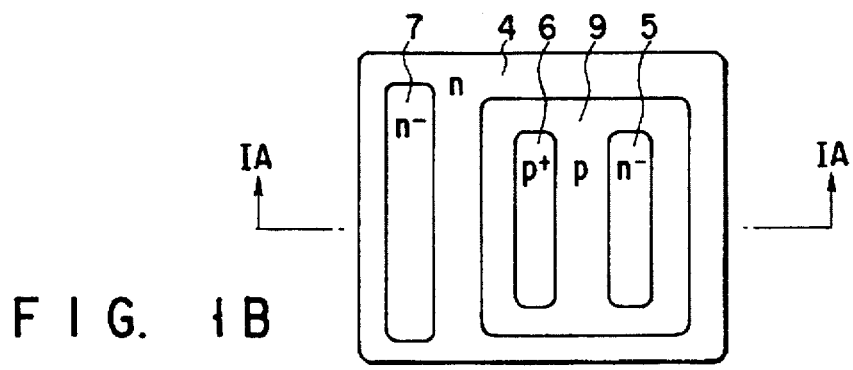

FIG. 1A is a sectional view showing the main part of a power IC (power semiconductor device) according to an embodiment of the present invention. FIG. 1B is a plan view showing the bipolar transistor of the IC.

A high-resistance active layer (SOI layer) 3 consisting of $n^-$-type silicon is arranged on a semiconductor substrate 1 consisting of silicon via an insulating layer 2 consisting of a silicon oxide film. In order to prepare this SOI structure, generally, the insulating layer 2 is formed on the active layer 3, and then the insulating layer 2 is bonded to the substrate 1 to connect the active layer 3 and the substrate 1. A thickness T1 of the active layer 3 is set to be 6 μm or less for the reason to be described later. A plurality of elemental devices (an npn bipolar transistor BT1 and an IGBT (insulated gate bipolar transistor) in FIG. 1A) are formed in the active layer 3. Insulating isolation between the elemental devices is performed by trench isolation. That is, a trench is formed in the active layer 3 to reach the insulating layer 2. This trench is filled with an insulating layer 8.

Referring to FIG. 1A, the left side region including the bipolar transistor BT1 is a logic portion, and the right side region including the IGBT is a high-withstand-voltage device section. The IGBT has the same structure as that in the prior art. The transistor BT1 has the following structure, which is different from that in the prior art.

An n-type well layer 4 is formed in the active layer 3 within the device region of the transistor BT1 by diffusion. A low-resistance $n^+$-type layer 7 and a p-type layer 9 are selectively formed in the surface of the n-type well layer 4 by diffusion. A low-resistance $n^+$-type layer 5 and a low-resistance $p^+$-type layer 6 are formed in the surface of the p-type layer 9 by diffusion. A thickness T2 of the n-type well layer 4 under the $p^+$-type layer 6 and the p-type layer 9 is set to be 1 μm or more for the reason to be described later. As shown in FIG. 1B, the $n^+$-type layer 5, the $p^+$-type layer 6, and the $n^+$-type layer 7 are formed as rectangular belt-like layers. The $p^+$-type layer 6 is interposed between the $n^+$-type layer 5 and the $n^+$-type layer 7. The layers 5, 9, 6, 9, 4, 7 appear side by side on the surface of the active layer 3 in the order named. An emitter electrode 5a, a base electrode 6a, and a collector electrode 7a are respectively formed on the $n^+$-type layer 5, the $p^+$-type layer 6, and the $n^+$-type layer 7. The n-type well layer 4 and the $n^+$-type layer 7 serve as a collector region. The p-type layer 9 and the $p^+$-type layer 6 serve as a base region. The $n^+$-type layer 5 serves as an emitter region. Electrons from the $n^+$-type layer 5 of the emitter region pass through the p-type layer 9 of the base region under the emitter region, reach the n-type well layer 4 of the collector region, and flow to the $n^+$-type layer 7.

This embodiment is different from the conventional bipolar transistor in that no $n^+$-type buried layer is formed in the bottom portion of the n-type well layer 4 serving as the collector region. In the embodiment, good device characteristics can be obtained without forming any $n^+$-type buried layer by setting the thickness T1 of the active layer 3 and the thickness T2 of the n-type well layer 4 under the $p^+$-type layer 6 and the p-type layer 9 within a specific range.

Figure 2:
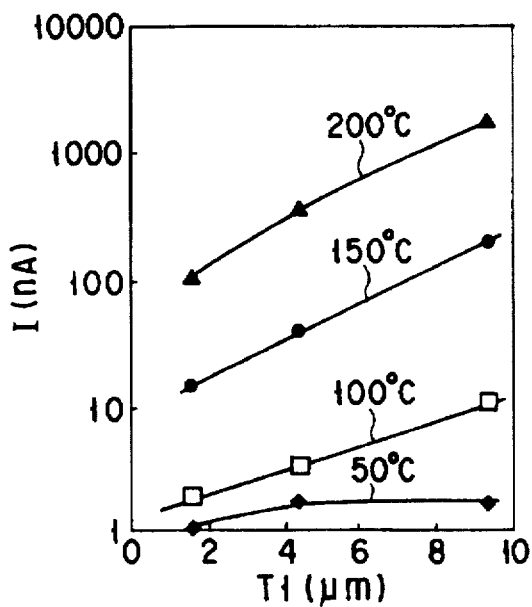
FIG. 2 is a graph showing the relationship between 5 the thickness of an SOI active layer and the leakage current.

FIG. 2 is a graph showing the relationship between the thickness T1 of the active layer 3 and a leakage current I. As shown in FIG. 2, with an increase in the operating temperature, the rate of increase in leakage current due to an increase in the thickness of the active layer 3 becomes higher. At a temperature of 50° C. near the room temperature, in particular, a decrease in leakage current occurs when the thickness of the active layer 3 is 6 μm or less. That is, the leakage current can be decreased at any operating temperature, in particular, at high operating temperatures, by setting the thickness of the SOI active layer 3 to be 6 μm or less.

Figure 3:
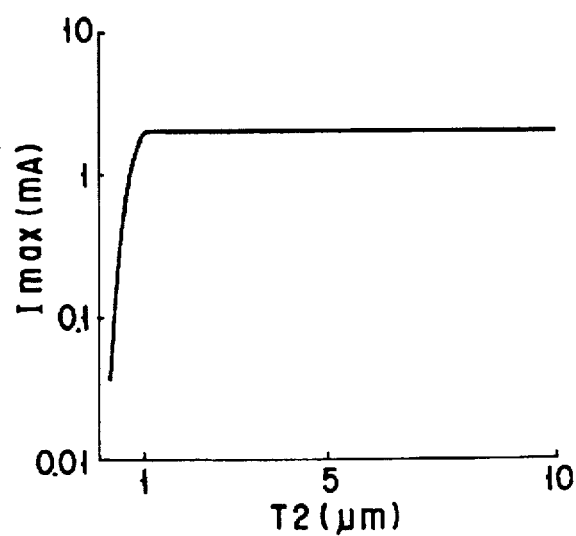
FIG. 3 is a graph showing the relationship between the thickness of an n-type well layer and the maximum current which can be flowed without decreasing the amplification factor.

FIG. 3 is a graph showing the relationship between the thickness T2 of the n-type well layer 4 under the $p^+$-type layer 6 and the p-type layer 9 and a maximum current Imax which can be flowed without decreasing an amplification factor Hfe. As shown in FIG. 3, as the thickness T2 becomes smaller than 1 μm, the maximum current Imax abruptly decreases.

That is, in forming a bipolar transistor in the SOI active layer 3, an increase in the leakage current and a decrease in the amplification factor Hfe can be suppressed by setting the thickness T1 of the active layer 3 to be 6 μm or less and the thickness T2 of the n-type well layer 4 under the $p^+$-type layer 6 and the p-type layer 9 to be 1 μm or more.

In this embodiment, since the thickness of the active layer 3 is 6 μm or less, a circuit which can operate up to a high temperature of 200° C. can be formed in the logic section. If the active layer 3 is sufficiently thin, a circuit which can operate up to a high temperature of 200° C. can be formed without trench isolation between low-withstand-voltage devices (a bipolar transistor, a CMOS, and the like). In addition, a circuit which can operate at higher temperatures can be realized by providing trench isolation.

In forming a high-withstand-voltage device such as an IGBT, an n-type impurity is ion-implanted into a prospective high-withstand-voltage device section first, and annealing (e.g., thermal diffusion) is then performed to make the distribution of the n-type impurity substantially uniform in the vertical direction. In this embodiment, since the thickness of the active layer 3 is 6 μm or less, the annealing time is several hours at an annealing temperature of 1,100° C.

Other embodiments of the present invention will be described below. The same reference numerals in the following drawings denote the same parts as in FIGS. 1A and 1B, and a detailed description thereof will be made as needed.

FIG. 4 is a sectional view showing the main part of a power IC according to another embodiment of the present invention.

In this embodiment, a structure similar to the one shown in FIGS. 1A and 1B is formed by using a high-resistance active layer 3 consisting of p⁻-type silicon. The well layers of a bipolar transistor BT1 and an IGBT do not reach an insulating layer 2. In other respects, this structure is the same as that shown in FIGS. 1A and 1B. Consequently, the thickness T1 of the active layer 3 is set to be 6 μm or less, and the thickness T2 of an n-type well layer 4 under a p⁺-type layer 6 and a p-type layer 9 is set to be 1 μm or more. With this structure, an increase in the leakage current and a decrease in the amplification factor Hfe can be suppressed.

FIG. 5A is a sectional view showing the main part of a power IC according to still another embodiment of the present invention. FIG. 5B is a plan view showing the bipolar transistor of this IC.

This embodiment has a bipolar transistor BT2 whose structure is slightly different from that of the bipolar transistor BT1 shown in FIGS. 1A and 1B. Similar to the bipolar transistor BT1, however, the bipolar transistor BT2 is of the npn type, and the thickness T1 of an active layer 3 and the thickness T2 of an n-type well layer 4 under a p⁺-type layer 6 and a p-type layer 9 are set to be 6 μm or less and 1 μm or more, respectively.

The characteristics of the bipolar transistor BT2 are well represented by the plan view in FIG. 5B. As shown in FIG. 5B, the p-type layer 9 has a rectangular surface and is located almost in the center of the n-type well layer 4. An n⁺-type layer 7 has a rectangular, ring-like surface and surrounds the p-type layer 9 almost concentrically. The p⁺-type layer 6 has a rectangular surface and is formed almost in the center of the p-type layer 9. An n⁺-type layer 5 has a rectangular, ring-like surface and surrounds the p⁺-type layer 6 almost concentrically. As shown in FIG. 1B, therefore, the layers 6, 9, 5, 9, 4, 7, and 4 appear on the surface of the active layer 3 almost concentrically in the order named.

Electrons from the n⁺-type layer 5 of an emitter region pass through the p-type layer 9 of a base region under the emitter region, reach the n-type well layer 4 of a collector region, and flow to the n⁺-type layer 7. Electrons from the n⁺-type layer 5 of the emitter region reach the n⁺-type layer 7 without passing through the portion under the p⁺-type layer 6. For this reason, the path of electrons is shortened to prevent an increase in resistance, thereby allowing a large current to flow.

Figures 6A, 6B:
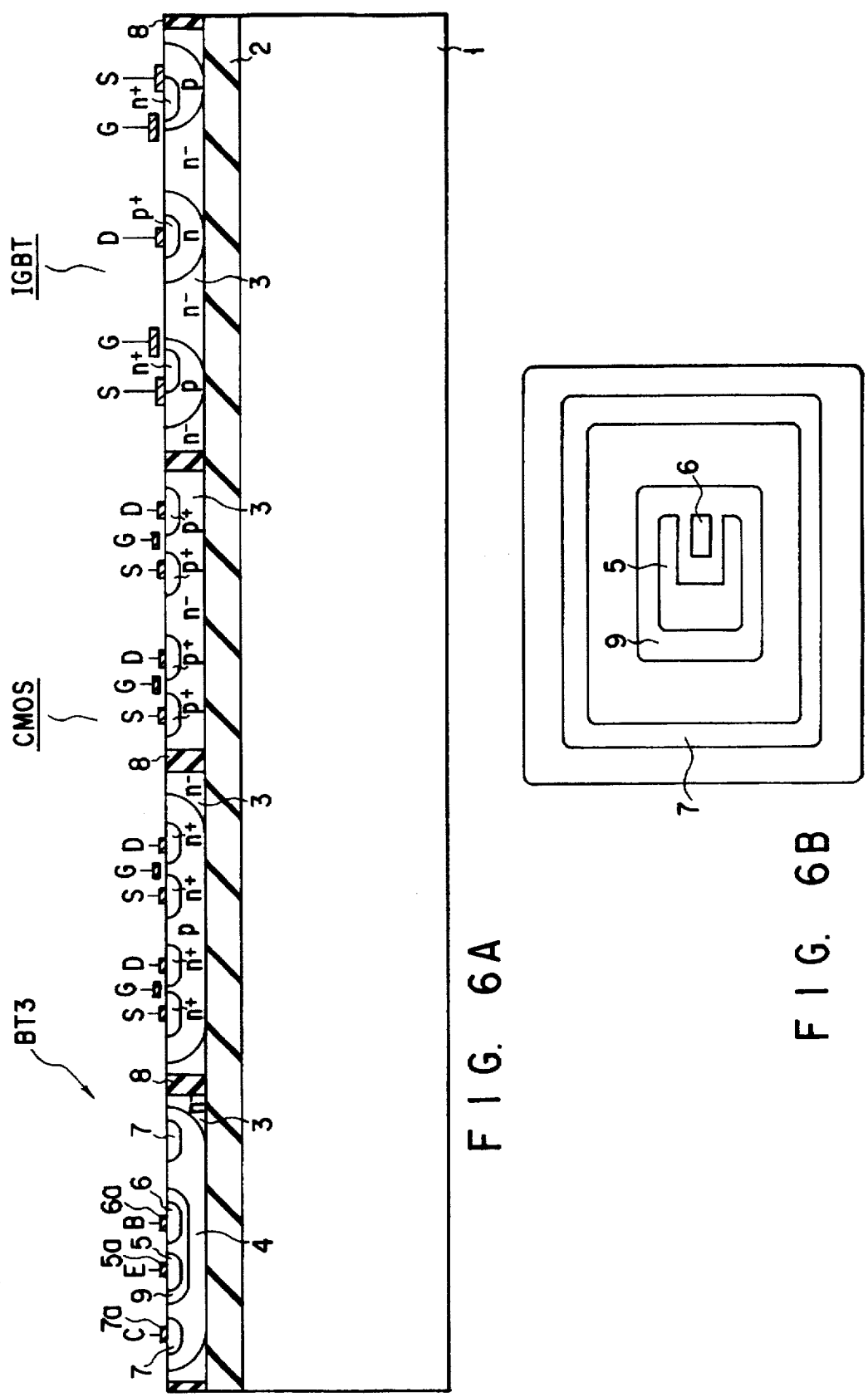
FIGS. 6A and 6B are a sectional view and a plan view, respectively, showing the main part of a power IC according to still another embodiment of the present invention.

FIG. 6A is a sectional view showing the main part of a power IC according to still another embodiment of the present invention. FIG. 6B is a plan view showing the bipolar transistor of this IC.

In this embodiment, in addition to a bipolar transistor BT3 and an IGBT, a CMOS is formed in an active layer 3. An n-type well layer for the CMOS (low-withstand-voltage device) is formed by diffusing an impurity shallowly from the surface of the active layer. In this case, where the well diffusion layer reaches an insulating layer under the active layer, the impurity concentration in the surface changes (the threshold voltage of the CMOS varies) as the thickness of the active layer varies. The annealing time required after the well diffusion layer reaches the insulating layer is, therefore, preferably set to be relatively short. From this viewpoint, in forming a well layer for the formation of a CMOS by diffusion, the impurity concentration preferably decreases from the surface to the inside.

Although the bipolar transistor BT3 is similar to the bipolar transistor BT2 shown in FIGS. 5A and 5B, their structures are slightly different from each other. Similar to the bipolar transistors BT1 and BT2, however, the bipolar transistor BT3 is of the npn type, and the thickness T1 of the active layer 3 and the thickness of an n-type well layer 4 under a p⁺-type layer 6 and a p-type layer 9 are set to be 6 μm or less and 1 μm or more, respectively.

The bipolar transistor BT3 is different from the bipolar transistor BT2 in that the p⁺-type layer 6 serving as the contact layer of a base region is not completely surrounded by an n⁺-type layer 5 serving as an emitter region. In the bipolar transistor BT3 having this arrangement as well, the path of electrons is short, and hence the same effects as those of the bipolar transistor BT2 can be obtained.

Figure 7:
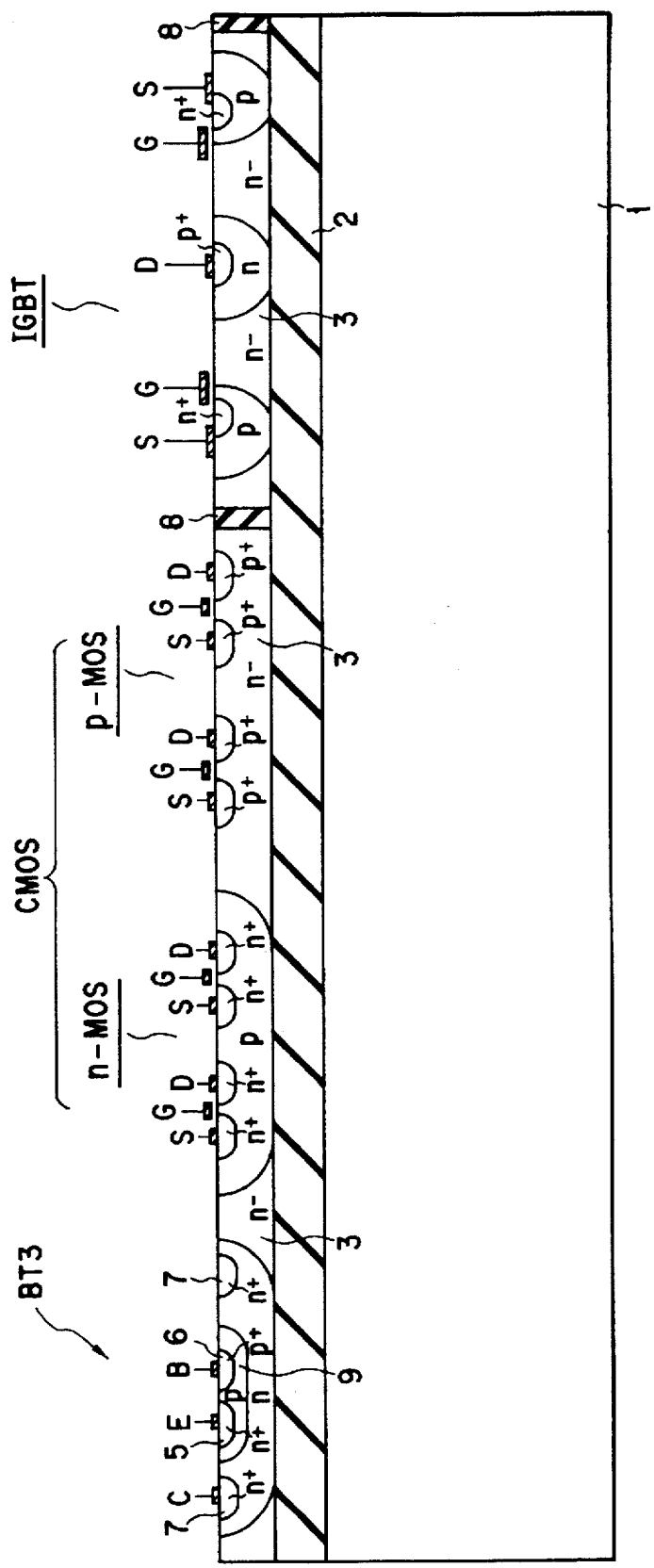
FIG. 7 is a sectional view showing the main part of a power IC according to still another embodiment of the present invention.

FIG. 7 is a sectional view showing the main part of a power IC according to still another embodiment of the present invention.

This embodiment has a structure similar to that of the power IC shown in FIG. 6A except that the trench between the device regions of the bipolar transistor BT3 and the CMOS is removed. When the thickness T1 of an active layer 3 is set to be 6 μm or less, a circuit which can operate up to a high temperature of 200° C. can be formed without trench isolation between low-withstand-voltage devices. If trench isolation is provided, a circuit which can operate at higher temperatures can be realized.

FIG. 8 is a graph showing the relationship between the thickness of the active layer 3 and the operating temperature of an analog circuit formed of elemental devices which are not trench-isolated from each other. As shown in FIG. 8, the thickness T1 of the active layer 3 should be 6 μm or less, in order to allow the analog circuit, formed in an SOI substrate where low-withstand-voltage devices are isolated from a substrate 1 by an insulating film 2 to operate at a temperature higher than 170° C., which is a critical operating temperature of an equivalent analog circuit formed on a conventional substrate using pn-junction isolation.

Figure 9:
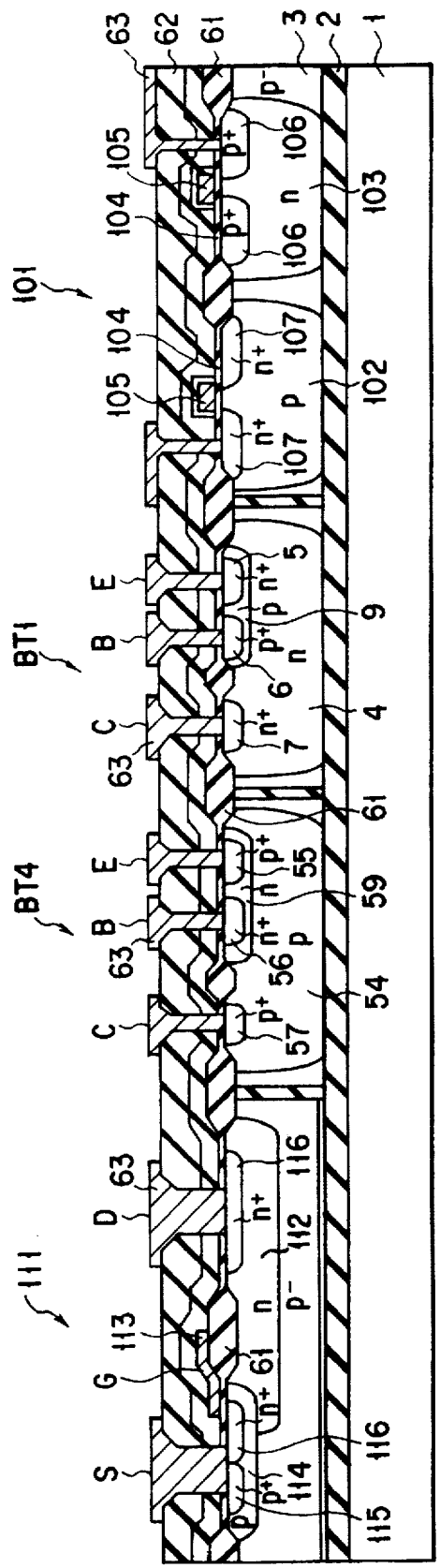
FIG. 9 is a sectional view showing the main part of a power IC according to still another embodiment of the present invention.

FIG. 9 is a sectional view showing the main part of a power IC according to still another embodiment of the present invention. In this embodiment, in addition to the npn bipolar transistor BT1 in FIG. 1A, a pnp bipolar transistor BT4, a CMOS 101, and a high-withstand-voltage MOSFET 111 are formed in an active layer 3.

This embodiment will be described below with reference to its manufacturing method.

First of all, a trench reaching an insulating layer 2 is formed in the high-resistance active layer 3, which consists of p⁻-type silicon and has the thickness T1 which is set to be 6 μm or less. The trench is filled with an insulating layer 8, thereby forming a structure in which the regions for the devices BT1, BT4, 101, and 111 are isolated from each other.

Subsequently, p-type well layers 54 and 102 of the transistor BT4 and the CMOS 101 are formed in the same step, and n-type well layers 4 and 103 of the transistor BT1 and the CMOS 101 are formed in the same step. The well layers 54, 102, 4, and 103 are formed by ion implantation and annealing. In this case, the diffusion layer for forming the well layer is prevented from reaching the insulating layer 2. Alternatively, when the diffusion layer reaches the insulating layer 2 upon annealing to be performed later, the annealing time in the subsequent steps is minimized as much as possible. Then, an n-type drift layer 112 is formed by ion implantation and annealing. A thick field oxide film 61 is formed, by a LOCOS (local oxidation of silicon) oxidation method, on a portion on which no diffusion layer or no polysilicon (polycrystalline silicon) gate is to be formed.

A polysilicon gate 113 of the MOSFET 111 is formed by deposition and selective etching. A p-type base layer 114 is then formed by ion implantation and annealing using the polysilicon gate 113 as a mask. An n-type layer 59 of the transistor BT4 is formed by ion implantation of phosphorus and annealing. A gate oxide film 104 of the CMOS 101 is formed. A polysilicon gate 105 is also formed by deposition and selective RIE. Furthermore, a p-type layer 9 of the transistor BT1 is formed by ion implantation of boron and annealing.

$p^+$-type layers 6, 55, 57, 106, and 115 of the devices BT1, BT4, 101, and 111 are formed in the same step. In addition, $n^+$-type layers 5, 7, 56, 107, and 116 of the devices are formed in the same step. The $p^+$-type layer 6 and the like are formed by ion implantation of $BF_2$ and annealing. The $n^+$-type layer 5 and the like are formed by ion implantation of As and annealing.

The entire surface of the resultant structure is covered with a CVD oxide film 62, and contact holes are formed. An aluminum layer is then formed to fill the contact holes by sputtering, and electrodes 63 are formed by selective RIE.

In the embodiment shown in FIG. 9 as well, the thickness T1 of the active layer is set to be 6 μm or less; the thickness T2 of the n-type well layer 4 under the p-type layer 9 of the transistor BT1, 1 μm or more; and the thickness T3 of the p-type well layer 54 under the n-type layer 59 of the transistor BT4, 1 μm or more. An increase in the leakage current and a decrease in the amplification factor of the transistors BT1 and BT4 can therefore be suppressed.

Figures 10, 11:
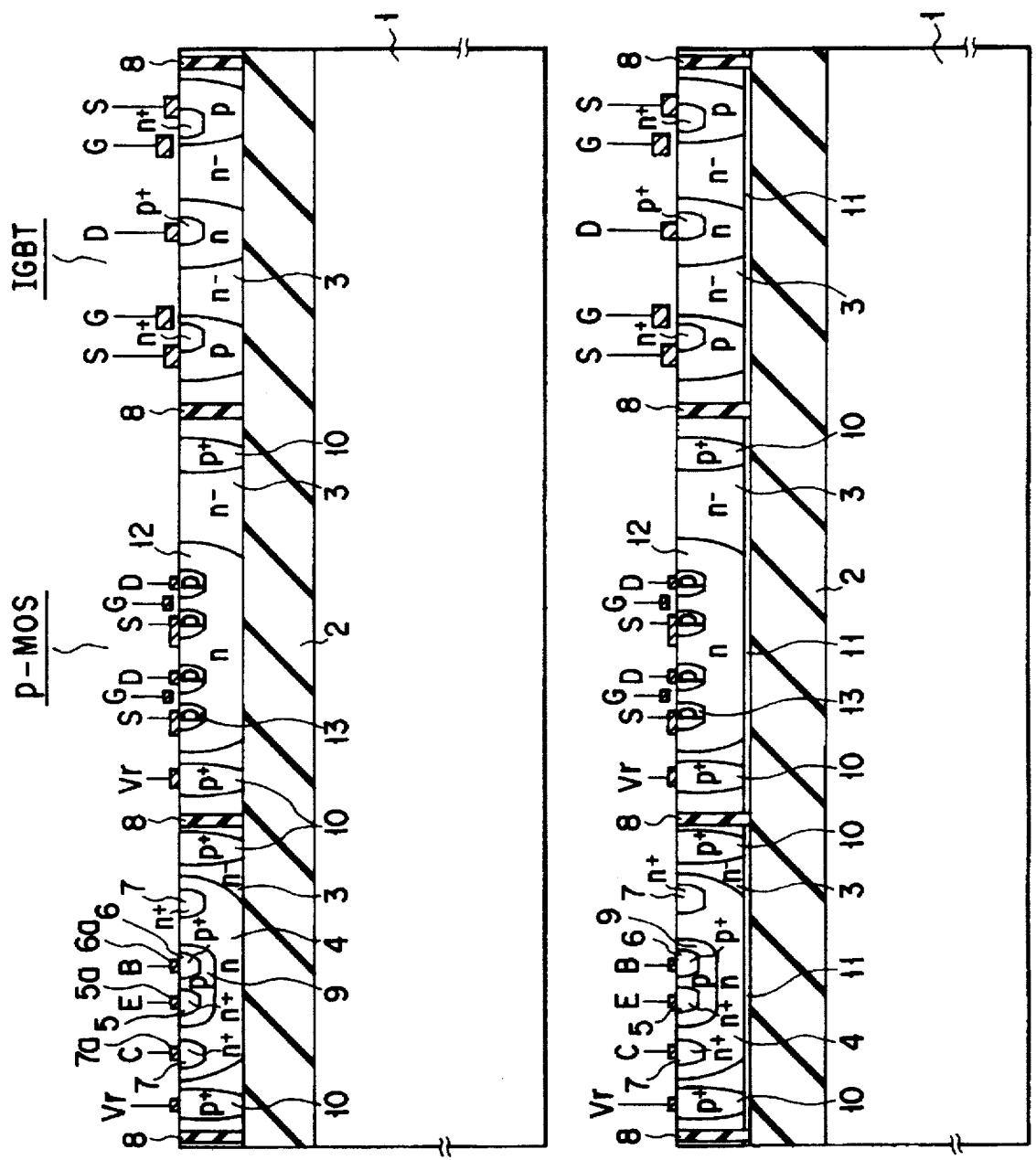
FIGS. 10 and 11 are sectional views showing the main part of a power IC according to still another embodiment of the present invention.

FIG. 10 is a sectional view showing the main part of a power IC using a thin SOI layer according to still another embodiment of the present invention.

In an npn bipolar transistor of this embodiment, a $p^+$-type ring layer 10 is formed to reach an insulating film from the substrate surface and surround an n-type well layer 4. A reference potential Vr for fixing a substrate potential is applied around the n-type well layer 4 through the $p^+$-type ring layer 10.

In general, when a high-withstand-voltage device (an IGBT or the like) and a low-withstand-voltage device (an npn bipolar transistor, p-type MOS transistor, or the like) are formed in the same SOI substrate, the potential of the low-withstand-voltage device sometimes becomes higher than the substrate potential as a whole. In this case, as shown in FIG. 11, a p-type inversion layer 11 is formed in the bottom portion of an active layer 3 consisting of $n^-$-type silicon, and a parasitic capacitance is formed by the p-type inversion layer 11, an insulating layer 2, and a silicon substrate 1.

In the conventional structure, part of a collector current flows into the silicon substrate 1 through the above parasitic capacitance. As a result (when the substrate current flows), the potential of the p-type inversion layer 11 (active layer 3) varies to cause noise, and the logic circuit in the logic portion operates erroneously.

In contrast to this, in this embodiment, since the reference potential Vr is applied to the p-type inversion layer 11 (active layer 3) through the $p^+$-type ring layer 10, even if a substrate current flows, variations in potential are suppressed to a negligible degree, and the above problem of the operation error can be solved.

In this embodiment, a p-type MOS transistor is also formed in the same SOI substrate, and a $p^+$-type ring layer 10 to which the reference potential Vr is applied is also formed for the p-type MOS transistor. In addition, in the embodiment, a source diffusion layer 13 and an n-type well layer 12 are short-circuited through a source electrode.

Figures 12, 14:
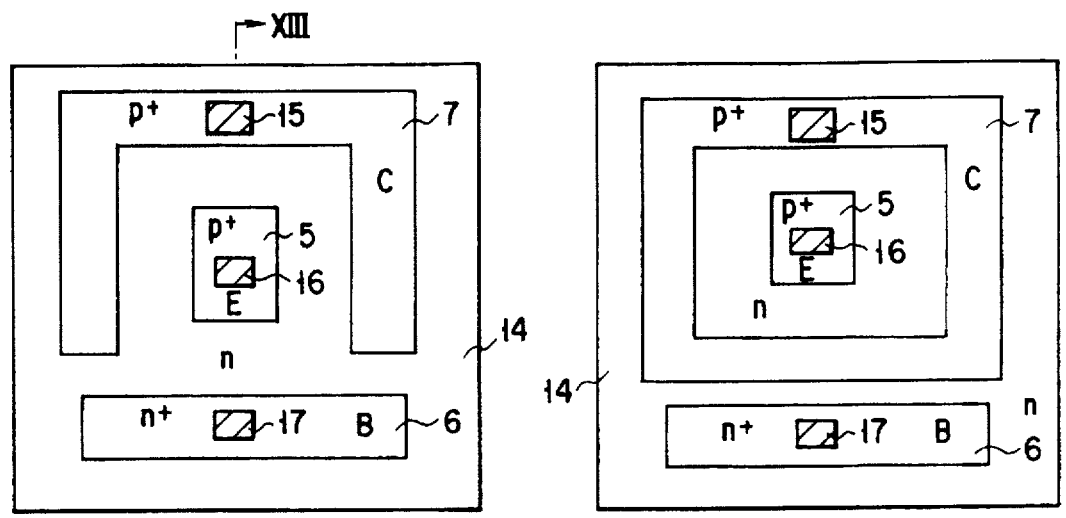
FIGS. 12 and 13 are a plan view and a sectional view, respectively, showing the main part of a power IC according to still another embodiment of the present invention.
FIG. 14 is a plan view showing a modification of the structure in FIG. 12.
Figure 13:
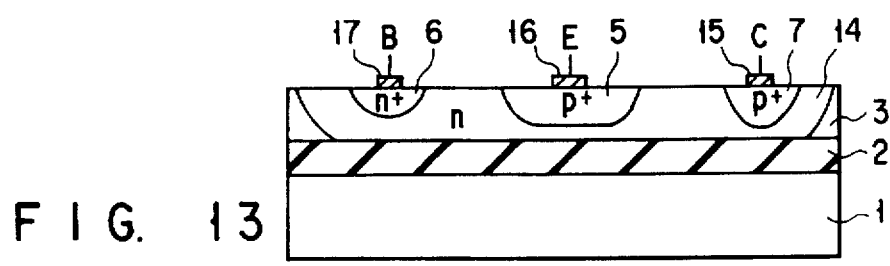

FIGS. 12 and 13 are a plan view and a sectional view, respectively, showing the main part of a power IC using a thin SOI layer according to still another embodiment of the present invention.

This embodiment relates to an improvement in a lateral pnp bipolar transistor. A $p^+$-type diffusion layer 5, a $p^+$-type diffusion layer 7, and a $n^+$-type diffusion layer 6 respectively serving as an emitter region, a collector region, and a base region are selectively formed in the surface of a well layer 14 serving as a base region. An emitter electrode 16, a collector electrode 15, and a base electrode 17 are formed on the low-resistance diffusion layers 5, 7, and 6, respectively.

The $p^+$-type layer 7 has a C-shaped surface to surround the $p^+$-type layer 5 except for a side opposing the $n^+$-type layer 6. That is, the $p^+$-type (collector region) layer 7 is not present between the $n^+$-type layer (base region) 6 and the $p^+$-type layer (emitter region) 5. For this reason, according to this embodiment, isolation between the $n^+$-type layer (base region) 6 and the $p^+$-type layer (emitter region) 5 due to a depletion layer, which poses a problem in the pnp bipolar transistor in FIG. 14, can be prevented.

Figure 15A:
FIGS. 15A to 15C are sectional views showing a method of forming an SOI substrate in the order of steps.
Figure 15B:
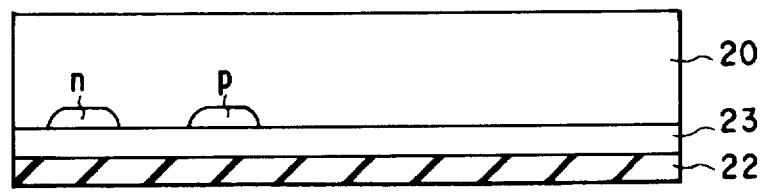
Figure 15C:
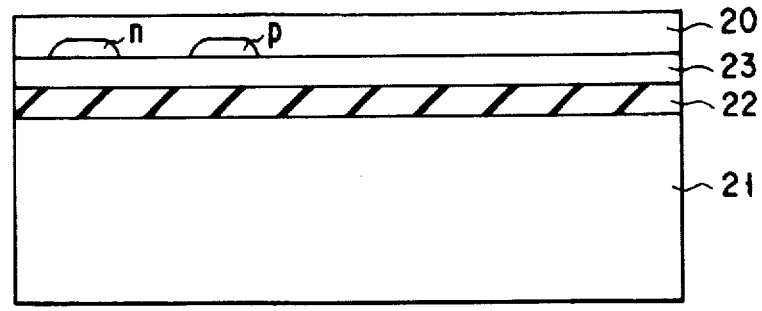

FIGS. 15A to 15C are sectional views showing a method of forming an SOI substrate in the order of steps.

As shown in FIG. 15A, an $n^+$-type buried layer 25 and a $p^+$-type buried layer 26 are selectively formed in the surface of a silicon substrate 20. An oxide film (not shown) such as a natural oxide film formed on the surface of the silicon substrate 20 is removed.

As shown in FIG. 15B, an SIPOS (semi-insulating polycrystalline silicon) layer 23 or a high-resistance polysilicon (polycrystalline silicon) layer is formed on the surface in which the $n^+$-type buried layer 25 and the $p^+$-type buried layer 26 are formed. An insulating film 22 consisting of a silicon oxide film is then formed on the SIPOS layer 23 by the CVD method. Thereafter, the surface of the insulating film 22 is polished to be flattened.

Finally, as shown in FIG. 15C, after the silicon substrate 20 and another silicon substrate 21 are directly joined to each other, the silicon substrate 20 is polished to a thickness of about several μm.

FIG. 16 is a sectional view showing the main part of a power IC according to still another embodiment of the present invention. This power IC uses the SOI substrate in FIG. 15.

FIG. 16 shows an IGBT serving as a high-withstand-voltage device (having a withstand voltage of 50 V or more), together with an npn bipolar transistor, a pnp bipolar transistor, and a CMOS constituting a low-withstand-voltage analog circuit. The respective elemental devices are isolated from each other through trenches filled with an insulating layer 24.

An $n^+$-type buried layer 25 serves as the collector region of the npn transistor together with an $n^+$-type diffusion layer 28. A $p^+$-type buried layer 26 serves as the collector region of the pnp transistor together with a $p^+$-type diffusion layer 31. A p-type diffusion layer 27 and an n-type diffusion layer 36 respectively serve as the base and emitter regions of the npn transistor. A p-type diffusion layer 29 and an n-type diffusion layer 30 respectively serve as the emitter and base regions of the pnp transistor.

According to this embodiment, a current flowing from the emitter electrode flows to the collector electrode through the $n^+$-type buried layer 25 ($p^+$-type buried layer 26) and the $n^+$-type diffusion layer 28 ($p^+$-type diffusion layer 31). For this reason, the resistance of the current path decreases, and the bipolar transistor is improved in terms of saturation voltage. This is very advantageous in realizing a high-precision analog circuit.

Figure 17:
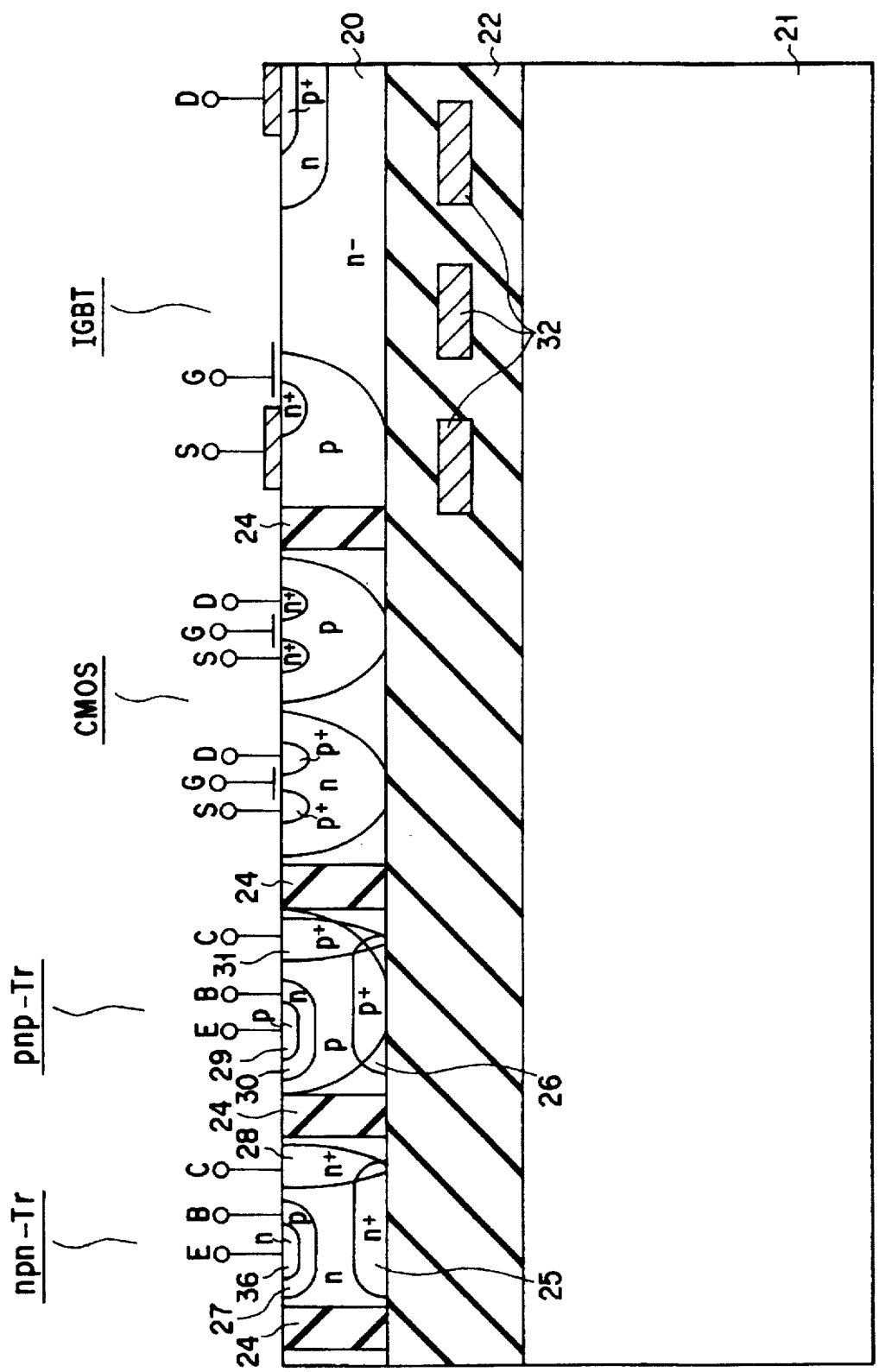

FIG. 17 is a sectional view showing the main part of a power IC according to still another embodiment of the present invention.

The main difference between the power IC of this embodiment and the power IC in FIG. 16 is that a polysilicon film 32 is used as a shield layer for the substrate potential instead of the SIPOS layer 23.

Figure 18:
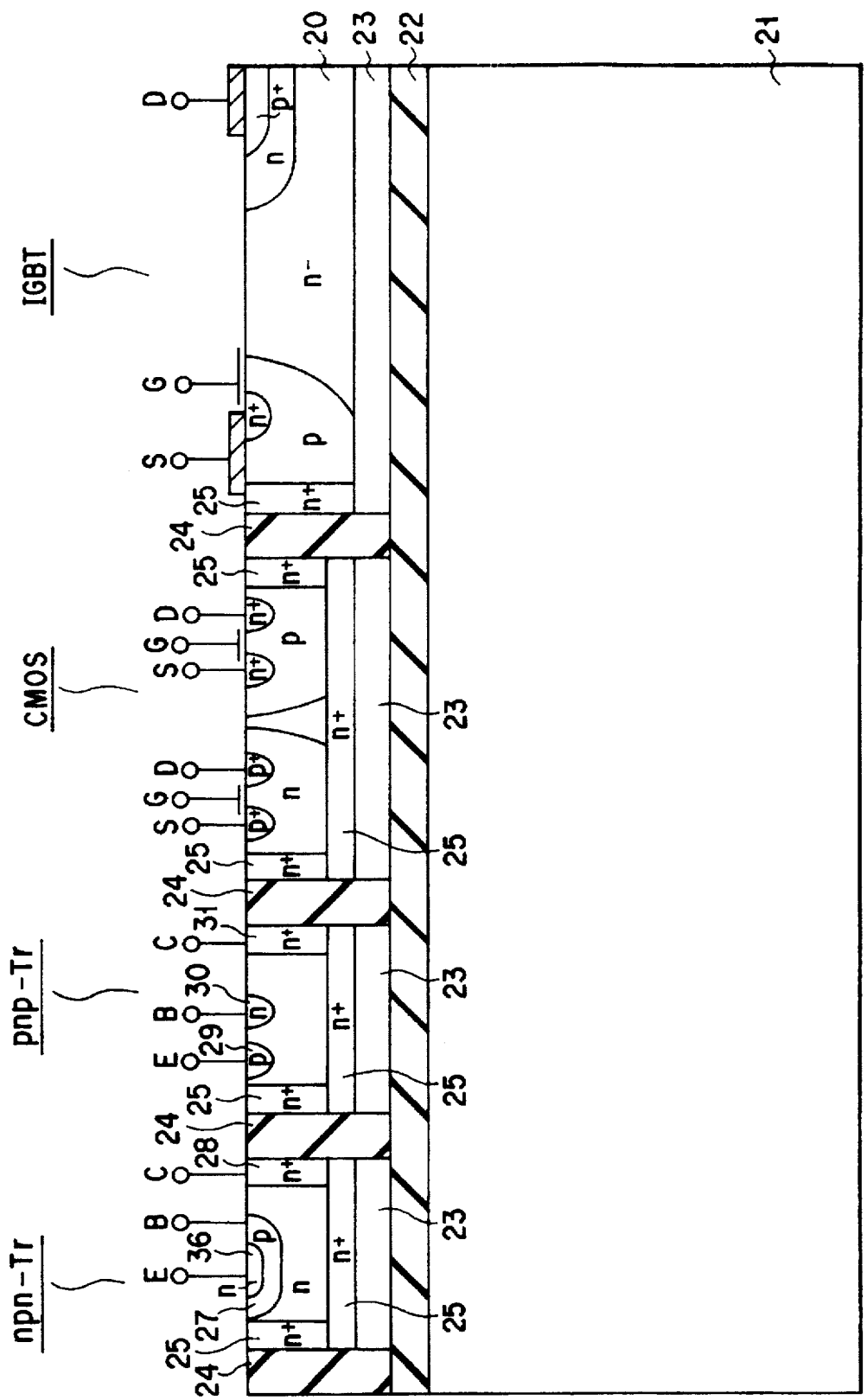

FIG. 18 is a sectional view showing the main part of a power IC according to still another embodiment of the present invention.

The main differences between the power IC of this embodiment and the power IC in FIG. 16 are that $n^+$-type buried layers 25 are also formed in the side walls of trenches, and a lateral pnp bipolar transistor is formed. In the embodiment, the characteristics of the pnp transistor are inferior to those of the transistor in FIG. 16. However, the cost of the SOI substrate can be decreased.

In each of the power IC shown in FIGS. 16 to 18, in order to prevent latch-up in the CMOS, the p-type MOS and n-type MOS transistors may be formed in different islands.

Figure 19:
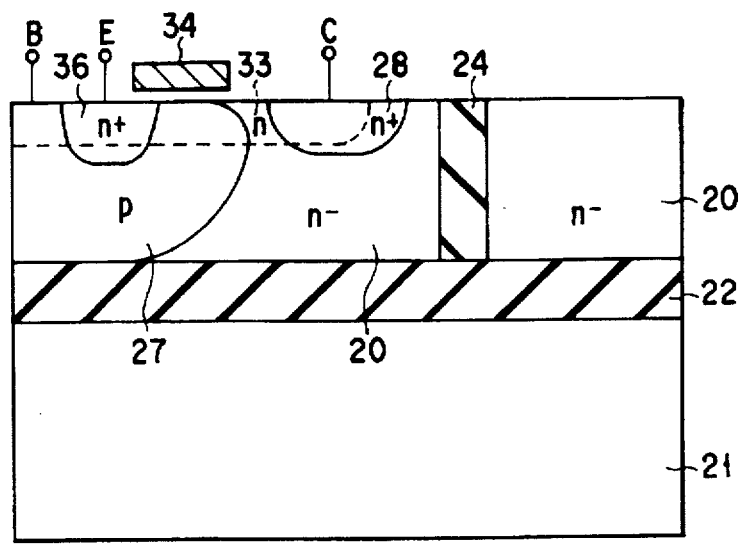

FIG. 19 is a sectional view showing the main part of a power IC according to still another embodiment of the present invention.

The power IC of this embodiment is different from the power ICs in FIGS. 16 to 18 in that the characteristics of a bipolar transistor are improved without using any buried layer.

A thin n-type diffusion layer 33 is selectively formed in the surface of a silicon substrate 20, as shown in FIG. 19. As a result, a lateral npn bipolar transistor, in which a current flows in the substrate surface in the lateral direction, is formed. A polysilicon film 34 is formed on the substrate surface via an insulating layer (not shown).

Since the n-type diffusion layer 33 decreases the carrier concentration near the surface of a p-type diffusion layer 27 serving as a base, the amplification factor of the transistor increases. In addition, the n-type diffusion layer 33 decreases the resistance of a $n^-$-type silicon substrate 20 between the p-type diffusion layer 27 and an $n^+$-type diffusion layer 28, thereby decreasing the saturation voltage of the bipolar transistor.

Figure 20:
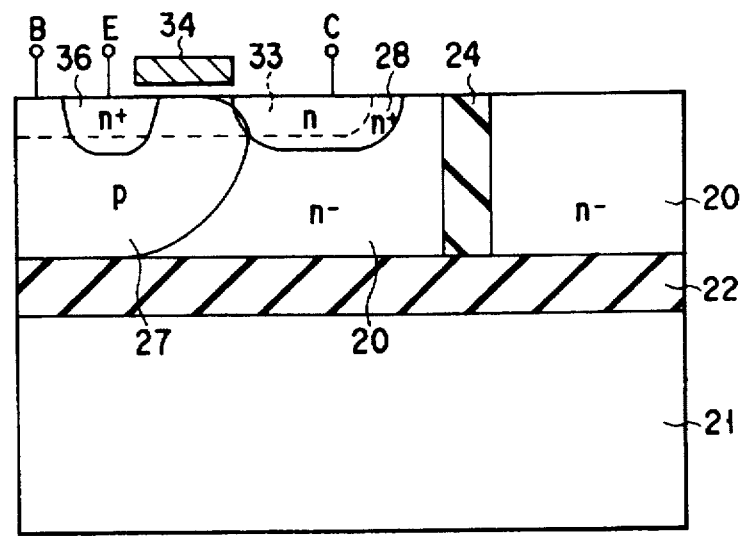

FIG. 20 is a sectional view showing the main part of a power IC according to still another embodiment of the present invention.

The difference between an npn bipolar transistor in this embodiment and the one shown in FIG. 19 is that a p-type diffusion layer 27 is in contact with an $n^+$-type diffusion layer 28. By making the p-type diffusion layer 27 and the $n^+$-type diffusion layer 28 contact each other, the saturation voltage can be further decreased.

Figure 21:
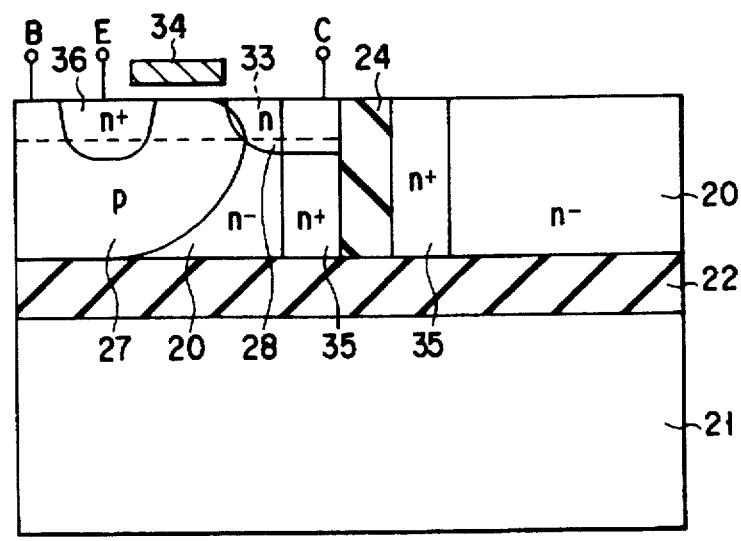

FIG. 21 is a sectional view showing the main part of a power IC according to still another embodiment of the present invention.

The difference between an npn in this embodiment in this embodiment and the one shown in FIG. 20 is that $n^+$-type diffusion layers 35 used as collector regions are added to the side walls of a trench to further improve the characteristics.

The present invention is not limited to each embodiment described above. For example, the above embodiments may be variously combined. In addition, in each embodiment described above, the silicon layer is used as the SOI layer. However, another type of semiconductor layer may be used. Furthermore, although the silicon oxide film is used as the insulating film for the SOI substrate, another type of insulating film may be used.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A power IC comprising:
   a support substrate having an insulating surface;
   a semiconductor active layer formed on said substrate, said active layer having a thickness which is set to be 6 μm or less;
   a device isolation layer formed to reach the insulating surface from a surface of said active layer so as to divide said active layer into first, second and third areas insulated and isolated from each other;
   a low-withstand-voltage, npn-bipolar transistor formed in the first area;
   a high-withstand-voltage, second semiconductor device formed in the second area and
   a low-withstand-voltage, CMOS transistor formed in the third area,
   said npn-bipolar transistor comprising:
   a first main well layer of an n-type formed in a surface of said active layer;
   a first sub-well layer of a p-type formed in a surface of said main well layer, said first main well layer under said first sub-well layer having a thickness which is a set to be 1 μm or more, said thickness of said active layer and said thickness of said first main well under said first sub-well being set so as to suppress a leakage current at high operating temperatures and maintaining a substantially maximum amplification factor of said npn-bipolar transistor by passing a current within said active layer and not through a separate low-resistance buried layer;
   a first emitter layer of the n-type formed in a surface of said first sub-well layer;
   a collector electrode formed on a surface of said first main well layer;
   a base electrode formed on a surface of said first sub-well layer; and an emitter electrode formed on a surface of said first emitter layer.

2. An IC according to claim 1, wherein said second semiconductor device comprises an IGBT.

3. An IC according to claim 1, wherein said second semiconductor device comprises a MOSFET.

4. An IC according to claim 1, further comprising a low-withstand-voltage, pnp-type bipolar transistor formed in a fourth area of said active layer, the fourth area being insulated and isolated from the first, second and third area, said pnp-type bipolar transistor comprising:
   a second main well layer of the n-type formed in a surface of said active layer;
   a second emitter and collector layer of the p-type formed in a surface of said second main well layer;
   a base electrode formed on a surface of said second main well layer;
   an emitter electrode formed on a surface of said second emitter layer; and
   a collector electrode formed on a surface of said second collector layer.

5. An IC according to claim 4, wherein said CMOS transistor comprises a third main well layer of the n-type and a fourth main well layer of the p-type which are formed in a surface of said active layer, and wherein said first, second and third main well layers are formed in the same step.

6. An IC according to claim 1, wherein said first main well layer under said first sub-well layer of said npn-bipolar transistor reaches the insulating surface.

7. An IC according to claim 1, wherein said npn-bipolar transistor further comprises:

a first low-resistance layer of the n-type formed in a surface of said first main well layer;

a second low-resistance layer of the p-type formed in a surface of said first sub-well layer; and a third low-resistance layer of the n-type formed in a surface of said first sub-well layer, said third low-resistance layer constituting said first emitter layer;

wherein said collector, base, and emitter electrodes of said npn-bipolar transistor being respectively formed on said first, second, and third low-resistance layers.

8. An IC according to claim 7, wherein said third low-resistance layer is formed between said first and second low-resistance layers.

9. An IC according to claim 8, wherein said first low-resistance layer is formed to surround said first sub-well layer.

10. An IC according to claim 1, further comprising a fourth low-resistance layer of the p-type formed in a surface of said active layer of said npn-bipolar transistor to reach the insulating surface, wherein a potential for fixing a potential of said active layer is applied to said fourth low-resistance layer.

11. A power IC comprising:

a support substrate having an insulating surface;

a semiconductor active layer formed on said substrate, said active layer having a thickness which is set to be 6 mm or less;

a device isolation layer formed to reach the insulating surface from a surface of said active layer so as to divide said active layer into first, second and third areas insulated and isolated from each other;

a low-withstand-voltage, pnp-bipolar transistor formed in the first area;

a high-withstand-voltage, second semiconductor device formed in the second area; and a low-withstand-voltage, CMOS transistor formed in the third area, said pnp-bipolar transistor comprising:

a first main well layer of an p-type formed in a surface of said active layer;

a first sub-well layer of a n-type formed in a surface of said main well layer, said first main well layer under said first sub-well layer having a thickness which is a set to be 1mm or more, said thickness of said active layer and said thickness of said first main well layer under said first sub-well being set so as to suppress a leakage current at high operating temperatures and maintaining a substantially maximum amplification factor of said pnp-bipolar transistor by passing a current within said active layer and not through a separate low-resistance buried layer;

a first emitter layer of the p-type formed in a surface of said first sub-well layer;

a collector electrode formed on a surface of said first main well layer;

a base electrode formed on a surface of said first sub-well layer; and an emitter electrode formed on a surface of said first emitter layer.

12. An IC according to claim 11, wherein said second semiconductor device comprises an insulated gate bipolar transistor.

13. An IC according to claim 11, wherein said second semiconductor device comprises a MOSFET.

14. An IC according to claim 11, wherein said first main well layer under said first sub-well layer of said pnp-bipolar transistor reaches the insulating surface.

15. An IC according to claim 11, wherein said pnp-bipolar transistor further comprises:

a first low-resistance layer of the p-type formed in a surface of said first main well layer;

a second low-resistance layer of the n-type formed in a surface of said first sub-well layer; and a third low-resistance layer of the p-type formed in a surface of said first sub-well layer, said third low-resistance layer constituting said first emitter layer, wherein said collector, base, and emitter electrodes of said pnp-bipolar transistor being respectively formed on said first, second, and third low-resistance layers.

16. An IC according to claim 11, wherein said support substrate comprises a backside layer made of silicon and an insulating layer made of a silicon oxide and formed on the backside layer, and the insulating surface is defined by a surface of the insulating layer.

17. A power IC comprising:

a support substrate having an insulating surface;

a semiconductor active layer formed on said substrate, said active layer having a thickness which is set to be 6 μm or less;

a device isolation layer formed to reach the insulating surface from a surface of said active layer so as to divide said active layer into first, second and third areas insulated and isolated from each other;

a low-withstand-voltage, pnp-bipolar transistor formed in the first area;

a high-withstand-voltage, second semiconductor device formed in the second area; and a low-withstand-voltage, CMOS transistor formed in the third area, said pnp-bipolar transistor comprising:

a main well layer of the n-type formed in a surface of said active layer;

emitter and collector layers of the p-type formed in a surface of said main well layer and configured so as to maintain a substantially maximum amplification factor of said pnp-bipolar transistor by passing a current within said active layer and not through a separate low-resistance buried layer;

a base electrode formed an a surface of said main well layer;

an emitter electrode formed on a surface of said emitter layer; and a collector electrode formed on a surface of said collector layer.

18. An IC according to claim 17, wherein said pnp-bipolar transistor further comprises:

a low-resistance layer of the n-type formed in a surface of said first main well layer, said base electrode being formed on said low-resistance layer.

19. An IC according to claim 18, wherein said low-resistance layer is formed between said emitter and collector layers.

20. An IC according to claim 19, wherein said collector layer is formed to surround said emitter layer with a cutout facing said low-resistance layer.

21. An IC according to claim 17, wherein said support substrate comprises a backside layer made of silicon and an insulating layer made of a silicon oxide and formed on the backside layer, and the insulating surface is defined by a surface of the insulating layer.

22. The IC according to claim 1, wherein said active layer has a substantially uniform thickness.

23. The IC according to claim 11, wherein said active layer has a substantially uniform thickness.

24. The IC according to claim 1, wherein said active layer has a substantially uniform thickness.

25. An IC according to claim 1, wherein said support substrate comprises a backside layer made of silicon and an insulating layer made of a silicon oxide and formed on the backside layer, and the insulating surface is defined by a surface of the insulating layer.

* * * * *